(12) United States Patent
Takeishi

(10) Patent No.: US 9,535,328 B2
(45) Date of Patent: Jan. 3, 2017

(54) DEVELOPING APPARATUS AND DEVELOPING METHOD

(71) Applicant: Kabushiki Kaisha Toshiba, Minato-ku (JP)

(72) Inventor: Tomoyuki Takeishi, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 215 days.

(21) Appl. No.: 14/341,920

(22) Filed: Jul. 28, 2014

(65) Prior Publication Data

US 2015/0234285 A1    Aug. 20, 2015

(30) Foreign Application Priority Data

Feb. 14, 2014    (JP) .................................. 2014-026208

(51) Int. Cl.
| | | |
|---|---|---|
| G03B 27/32 | (2006.01) | |
| G03F 7/30 | (2006.01) | |
| G03F 7/40 | (2006.01) | |
| H01L 21/67 | (2006.01) | |

(52) U.S. Cl.
CPC ............... G03F 7/3021 (2013.01); G03F 7/40 (2013.01); H01L 21/6715 (2013.01); H01L 21/67051 (2013.01)

(58) Field of Classification Search
CPC .... G03F 7/3021; G03F 7/40; H01L 21/67051; H01L 21/6715
USPC .......................................................... 355/27
See application file for complete search history.

(56) References Cited

U.S. PATENT DOCUMENTS

| | | |
|---|---|---|
| 6,096,233 A | 8/2000 | Taniyama et al. |
| 6,602,382 B1 | 8/2003 | Matsuyama et al. |
| 8,440,266 B2 | 5/2013 | Sato et al. |
| 2004/0028403 A1* | 2/2004 | Sanada ..................... G03D 5/00 396/611 |
| 2007/0183775 A1* | 8/2007 | Mitsuhashi ........... G03F 7/3021 396/611 |

FOREIGN PATENT DOCUMENTS

| | | |
|---|---|---|
| JP | 10-154701 | 6/1998 |
| JP | 2000-147787 | 5/2000 |
| JP | 2001-196301 | 7/2001 |
| JP | 2004-193538 A | 7/2004 |
| JP | 2010-182931 | 8/2010 |
| JP | 2013-175677 | 9/2013 |

OTHER PUBLICATIONS

Japanese Office Action mailed Sep. 27, 2016 in Japanese Patent Application No. 2014-026208 with English translation, 9 pages.

* cited by examiner

*Primary Examiner* — Peter B Kim
(74) *Attorney, Agent, or Firm* — Oblon, McClelland, Maier & Neustadt, L.L.P.

(57) ABSTRACT

According to one embodiment, a developing apparatus and method comprises moving a first nozzle from a scan start position to a scan end position, with holding a second nozzle for supplying a rinse solution to be adjacent to the scan start position for the first nozzle, while supplying a developing solution from the first nozzle onto a wafer being rotated; and supplying the rinse solution from the second nozzle onto the wafer being rotated.

20 Claims, 10 Drawing Sheets

DEVELOPING APPARATUS AND DEVELOPING METHOD

CROSS-REFERENCE TO RELATED APPLICATIONS

This application is based upon and claims the benefit of priority from Japanese Patent Application No. 2014-26208, filed on Feb. 14, 2014; the entire contents of which are incorporated herein by reference.

FIELD

Embodiments described herein relate generally to a developing apparatus and developing method.

BACKGROUND

As to developing a resist film on a semiconductor wafer, there is a method which scans a developing solution nozzle in a radial direction of the semiconductor wafer while having the developing solution nozzle jet a developing solution to the surface of the semiconductor wafer with the semiconductor wafer being rotated, thereby forming a developing solution film over the surface of the semiconductor wafer.

DETAILED DESCRIPTION

Figure 1A:
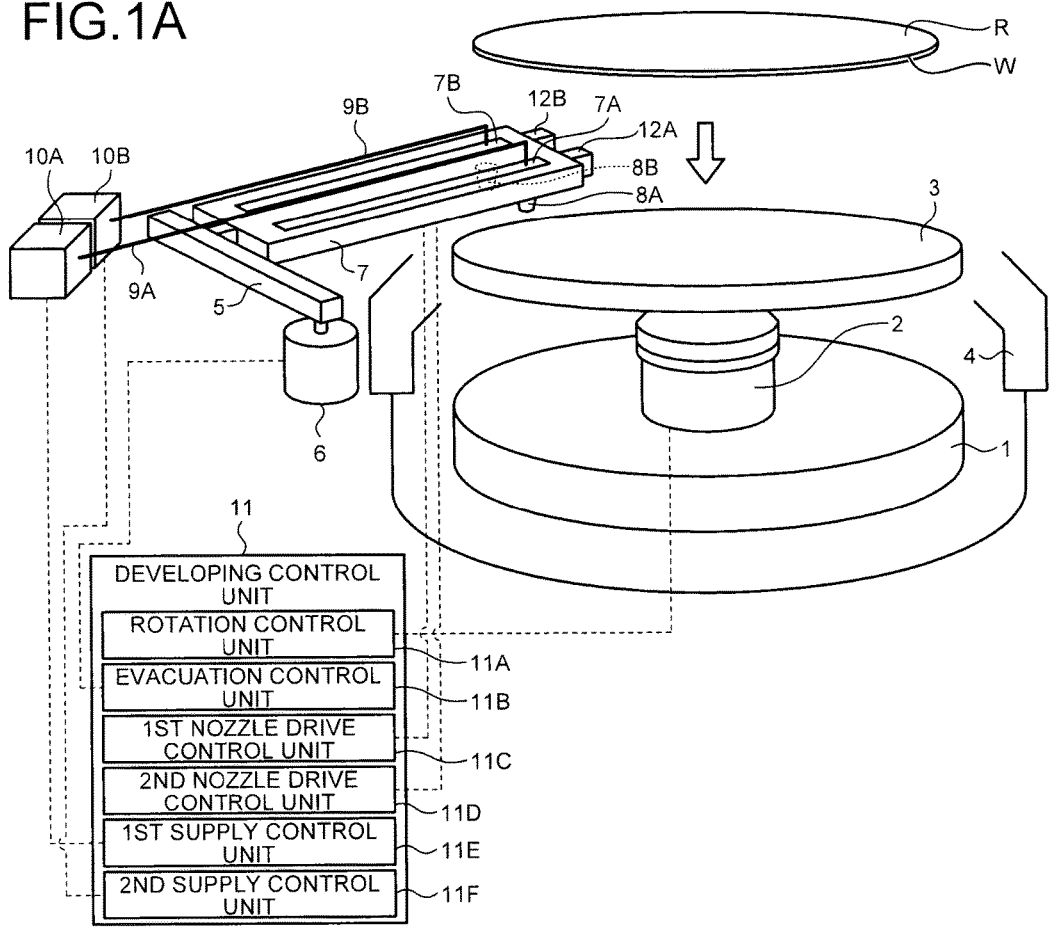
FIGS. 1A and 1B are perspective views showing an example of a developing method according to a first embodiment.

According to one embodiment, a developing apparatus and method comprises moving a first nozzle from a scan start position to a scan end position, with holding a second nozzle for supplying a rinse solution to be adjacent to the scan start position for the first nozzle, while supplying a developing solution from the first nozzle onto a wafer being rotated; and supplying the rinse solution from the second nozzle onto the wafer being rotated.

The developing apparatuses and developing methods according to embodiments will be described in detail below with reference to the accompanying drawings. The present invention is not limited to these embodiments.

First Embodiment

FIGS. 1A, 1B, 2A, 2B, 3A, and 3B are perspective views showing an example of a developing apparatus and developing method according to the first embodiment.

In FIGS. 1A, 1B, 2A, 2B, 3A, and 3B, this developing apparatus comprises a wafer holder 3 to hold a wafer W, a support mount 1 supporting the wafer holder 3, a motor 2 rotating the wafer holder 3, a cup 4 to receive splashes of a developing solution 13A and a rinse solution 13B, a developing solution nozzle 8A to supply the developing solution 13A onto the wafer W, a rinse nozzle 8B to supply the rinse solution 13B onto the wafer W, a nozzle guide 7 provided with guide sections 7A, 7B and nozzle drivers 12A, 12B, an arm 5 supporting the nozzle guide 7, and a motor 6 driving the arm 5. The guide sections 7A, 7B can guide the developing solution nozzle 8A and the rinse nozzle 8B so as to be able to scan over the wafer W independently. The nozzle driver 12A drives the developing solution nozzle 8A with being guided by the guide section 7A. The nozzle driver 12B drives the rinse nozzle 8B with being guided by the guide section 7B. Note that the guide sections 7A, 7B can be provided to be shaped like straight lines parallel to each other. The nozzle drivers 12A, 12B can move respectively the developing solution nozzle 8A and the rinse nozzle 8B linearly. Here, where a motor is used as a powering unit, a conversion mechanism can be provided which converts the rotational motion of the motor into linear motion.

Here, the wafer holder 3 is placed on the support mount 1 via the motor 2. The cup 4 is placed surrounding the wafer holder 3. The motor 6 is connected to the nozzle guide 7 via the arm 5. The developing solution nozzle 8A is connected to a developing solution supply pipe unit 10A via a developing solution supply pipe 9A. The rinse nozzle 8B is connected to a rinse solution supply pipe unit 10B via a rinse solution supply pipe 9B. The developing solution supply pipe 9A and the rinse solution supply pipe 9B can be formed of flexible material such as resin not to prevent the developing solution nozzle 8A and the rinse nozzle 8B from moving. The developing solution supply pipe unit 10A and the rinse solution supply pipe unit 10B may have a pump, a valve, and the like for sending out and stopping the developing solution 13A and the rinse solution 13B respectively.

Further, this developing apparatus comprises a developing control unit 11 to control the development of a resist film R coated on the wafer W. The developing control unit 11 comprises a rotation control unit 11A, an evacuation control unit 11B, a first nozzle drive control unit 11C, a second nozzle drive control unit 11D, a first supply control unit 11E, and a second supply control unit 11F.

The rotation control unit 11A controls the rotation of the motor 2. The evacuation control unit 11B controls the drive of the motor 6. The first nozzle drive control unit 11C drives and controls the nozzle driver 12A. The second nozzle drive control unit 11D drives and controls the nozzle driver 12B. The first supply control unit 11E controls the supply of the developing solution 13A. The second supply control unit 11F controls the supply of the rinse solution 13B.

The first nozzle drive control unit 11C drives and controls the developing solution nozzle 8A to move from a scan start position up to a scan end position while supplying the developing solution 13A onto the wafer W. The second nozzle drive control unit 11D drives and controls the rinse nozzle 8B to move from a scan start position up to a scan end position while supplying the rinse solution 13B onto the wafer W. Further, the second nozzle drive control unit 11D moves the rinse nozzle 8B to the scan start position for the rinse nozzle 8B when the developing solution nozzle 8A is in the scan start position for the developing solution nozzle 8A. Note that the scan start positions for the developing solution nozzle 8A and the rinse nozzle 8B can be set at the center of the wafer W and that the scan end positions for the developing solution nozzle 8A and the rinse nozzle 8B can be set at a place in the periphery of the wafer W.

The arm 5 is driven via the motor 6, thereby evacuating the nozzle guide 7 outside the wafer holder 3 as shown in FIG. 1A. Then the wafer W coated with the resist film R is placed on the wafer holder 3. The wafer W can be fixed on the wafer holder 3 by, e.g., vacuum suction or the like. A latent image according to a pattern to be formed on the wafer W can be formed beforehand in the resist film R by exposure. While the nozzle guide 7 is evacuated outside the wafer holder 3, the developing solution nozzle 8A and the rinse nozzle 8B can be moved to the scan start positions along the guide sections 7A, 7B respectively.

Figure 1B:
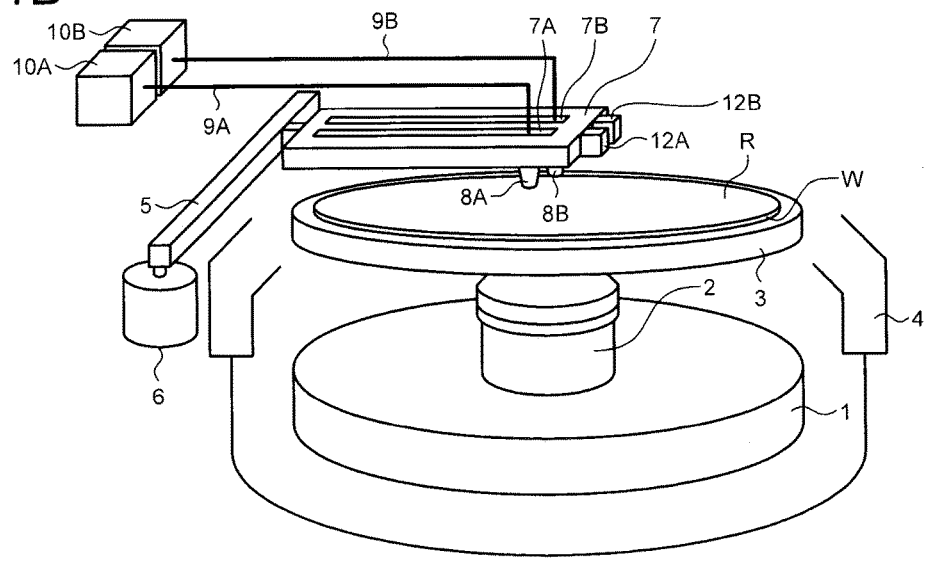

Then the arm 5 is driven via the motor 6 in the opposite direction to that at the time of evacuation, so that the nozzle guide 7 is moved to a position over the wafer W as shown in FIG. 1B. At this time, the developing solution nozzle 8A and the rinse nozzle 8B can be brought to a position over the center of the wafer W.

Figure 2A:
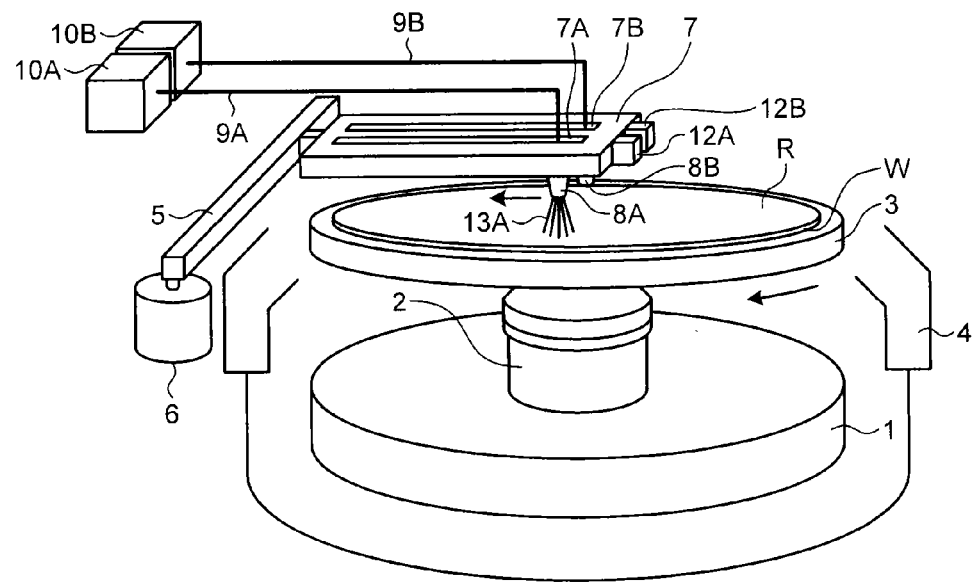
FIGS. 2A and 2B are perspective views showing the example of the developing method according to the first embodiment.
Figure 2B:
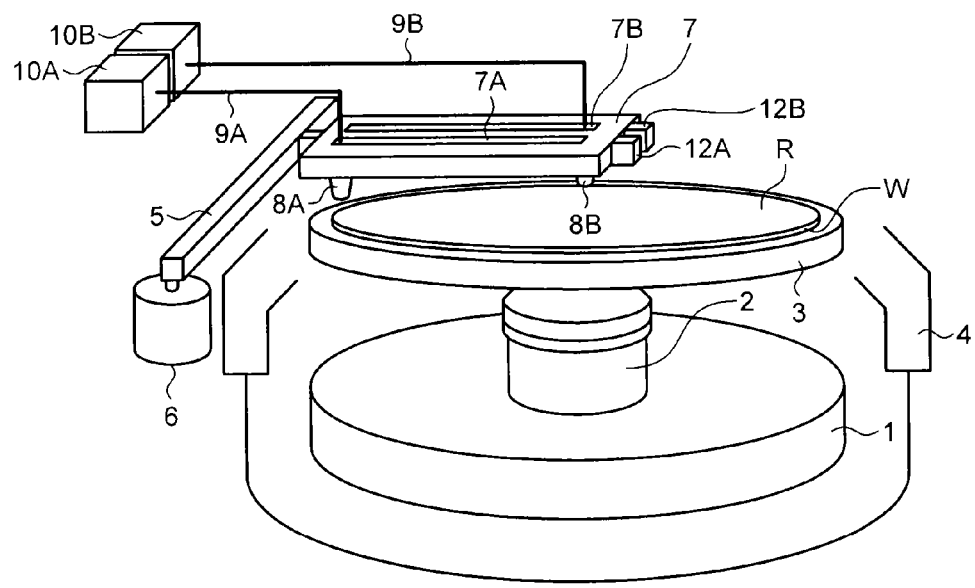

Then, as shown in FIGS. 2A and 2B, the wafer holder 3 is rotated via the motor 2, thereby rotating the wafer W. Then, with the rinse nozzle 8B staying still in the center of the wafer W, the developing solution nozzle 8A is moved along the guide section 7A from the center of the wafer W toward the periphery thereof while the developing solution 13A is being supplied from the nozzle 8A onto the wafer W. When the developing solution nozzle 8A reaches the periphery of the wafer W, part of the developing solution 13A splashes outside. The splashes of the developing solution 13A can be retrieved by the cup 4. At this time, by holding the rinse nozzle 8B still in the center of the wafer W, splashes of the developing solution 13A can be prevented from sticking to the rinse nozzle 8B. Hence, while the rinse nozzle 8B is scanned over the wafer W, drops of the developing solution 13A can be prevented from falling off the rinse nozzle 8B onto the wafer W, thus preventing the occurrence of particles on the wafer W.

When the developing solution nozzle 8A reaches the periphery of the wafer W, the supply of the developing solution 13A is stopped. When the developing solution 13A is supplied onto the wafer W, the resist film R having a latent image formed therein is developed. At this time, static development can be performed for only 30 seconds, for example.

Figure 3A:
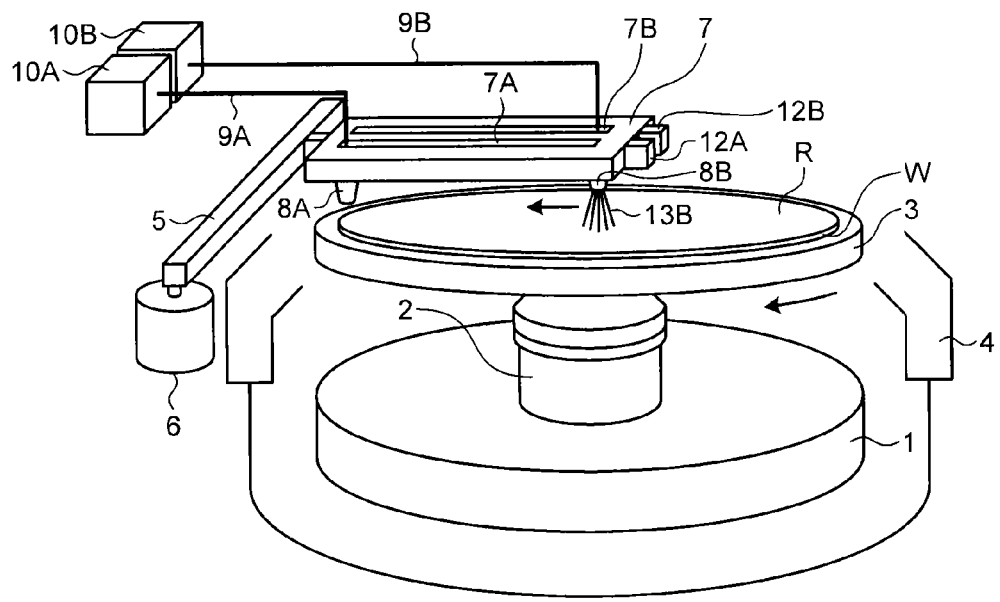
FIGS. 3A and 3B are perspective views showing the example of the developing method according to the first embodiment.
Figure 3B:
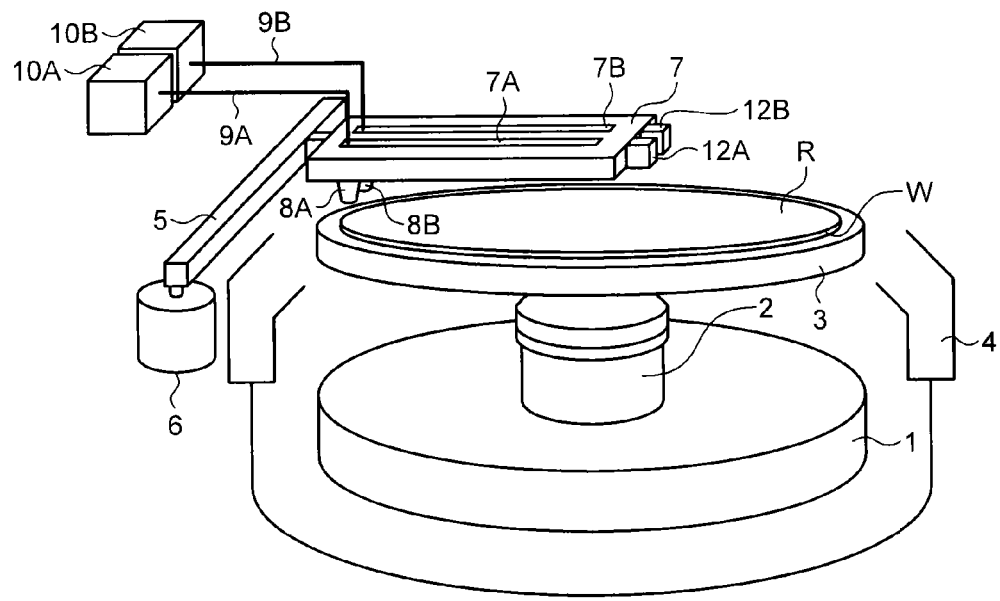

Next, as shown in FIGS. 3A and 3B, the rinse nozzle 8B is moved along the guide section 7B from the center of the wafer W toward the periphery while the rinse solution 13B is being supplied from the nozzle 8B onto the wafer W. When the rinse nozzle 8B reaches the periphery of the wafer W, the supply of the rinse solution 13B is stopped. Note that, for example, pure water can be used as the rinse solution 13B. When the rinse solution 13B is supplied onto the wafer W, the developing solution 13A is drained from the wafer W, thus stopping development. Further, while the rinse solution 13B is being supplied, the wafer W is rotated, thus being spin-dried.

Moving the rinse nozzle 8B to the scan start position for the rinse nozzle 8B while the developing solution nozzle 8A is in the scan start position for the developing solution nozzle 8A, eliminates the need to move the rinse nozzle 8B to the scan start position after the developing solution nozzle 8A reaches the scan end position. Accordingly, the time necessary to move the rinse nozzle 8B to the scan start position can be reduced, thus improving productivity.

Further, by providing the nozzle guide 7 to guide the developing solution nozzle 8A and the rinse nozzle 8B, the developing solution nozzle 8A and the rinse nozzle 8B can be evacuated together at one time. Accordingly, an evacuation mechanism need not be provided separately for the developing solution nozzle 8A and the rinse nozzle 8B, and thus the evacuation mechanism can be simplified.

Second Embodiment

FIGS. 4A, 4B, 5A, 5B, 6A, and 6B are perspective views showing an example of a developing apparatus and developing method according to the second embodiment.

In FIGS. 4A, 4B, 5A, 5B, 6A, and 6B, this developing apparatus comprises a nozzle guide 7' and a developing control unit 11' instead of the nozzle guide 7 and developing control unit 11 of the developing apparatus of FIG. 1A. This developing apparatus has added thereto a gas jet nozzle 8C to jet a gas 13C onto a wafer W. For example, nitrogen gas can be used as the gas 13C.

The nozzle guide 7' has a guide section 7C and a nozzle driver 12C added thereto as compared with the nozzle guide 7 of FIG. 1A. The guide section 7C can guide the gas jet nozzle 8C so as to be able to scan over the wafer W with being adjacent to the rinse nozzle 8B. The nozzle driver 12C drives the gas jet nozzle 8C with being guided by the guide section 7C. Note that the guide sections 7A, 7B, 7C can be provided to be shaped like straight lines parallel to each other. The nozzle driver 12C can move the gas jet nozzle 8C linearly. Here, where a motor is used as a powering unit, a conversion mechanism can be provided which converts the rotational motion of the motor into linear motion.

Here, the motor 6 is connected to the nozzle guide 7' via the arm 5. The gas jet nozzle 8C is connected to a gas supply pipe unit 100 via a gas supply pipe 9C. The gas supply pipe 9C can be formed of flexible material such as resin not to prevent the gas jet nozzle 8C from moving. The gas supply pipe unit 10C may have a pump, a valve, and the like for sending out and stopping the gas 13C.

The developing control unit 11' has a third nozzle drive control unit 11G and a third supply control unit 11H added thereto as compared with the developing control unit 11 of FIG. 1A. The third nozzle drive control unit 11G drives and controls the nozzle driver 12C. The third supply control unit 11H controls the supply of the gas 13C.

The third nozzle drive control unit 11G drives and controls the gas jet nozzle 8C to move from a scan start position up to a scan end position while supplying the gas 13C onto the wafer W. Further, the third nozzle drive control unit 11G moves the gas jet nozzle 8C to the scan start position for the gas jet nozzle 8C when the developing solution nozzle 8A is in the scan start position for the developing solution nozzle 8A. Note that the scan start position for the gas jet nozzle 8C can be set at the center of the wafer W and that the scan end position for the gas jet nozzle 8C can be set at a place in the periphery of the wafer W.

Figure 4A:
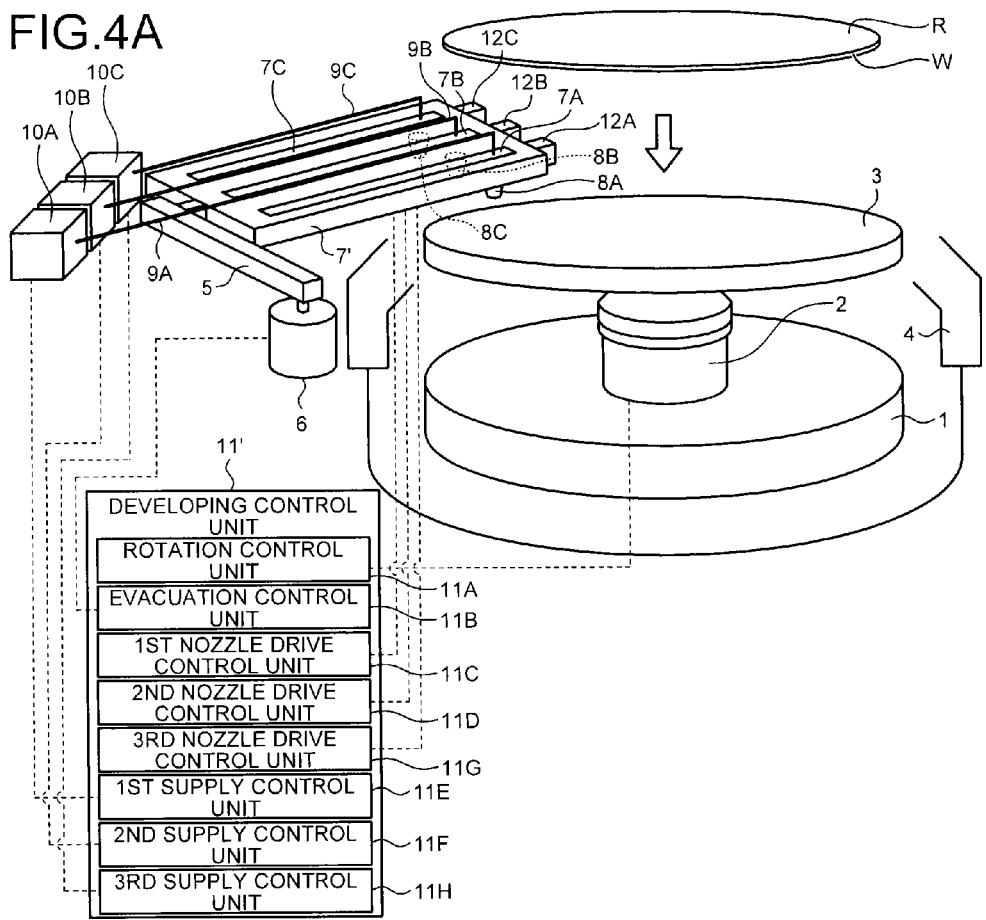
FIGS. 4A and 4B are perspective views showing an example of a developing method according to a second embodiment.

As shown in FIG. 4A, the arm 5 is driven via the motor 6, thereby evacuating the nozzle guide 7' outside the wafer holder 3. Then the wafer W coated with the resist film R is placed on the wafer holder 3. While the nozzle guide 7' is evacuated outside the wafer holder 3, the developing solution nozzle 8A, the rinse nozzle 8B, and the gas jet nozzle 8C can be moved to the scan start positions along the guide sections 7A, 7B, 7C respectively.

Figure 4B:
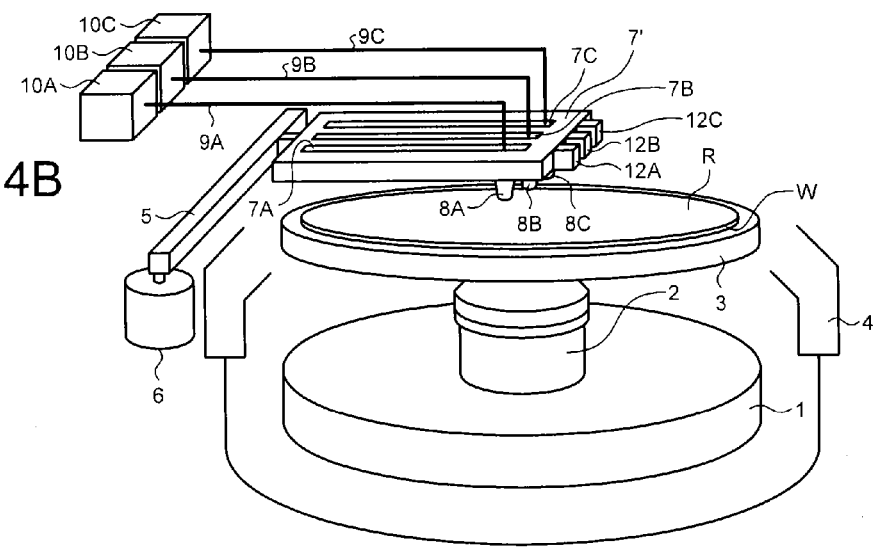

Then the arm 5 is driven via the motor 6 in the opposite direction to that at the time of evacuation, so that the nozzle guide 7' is moved to a position over the wafer W as shown in FIG. 4B. At this time, the developing solution nozzle 8A, the rinse nozzle 8B, and the gas jet nozzle 8C can be brought to a position over the center of the wafer W.

Figure 5A:
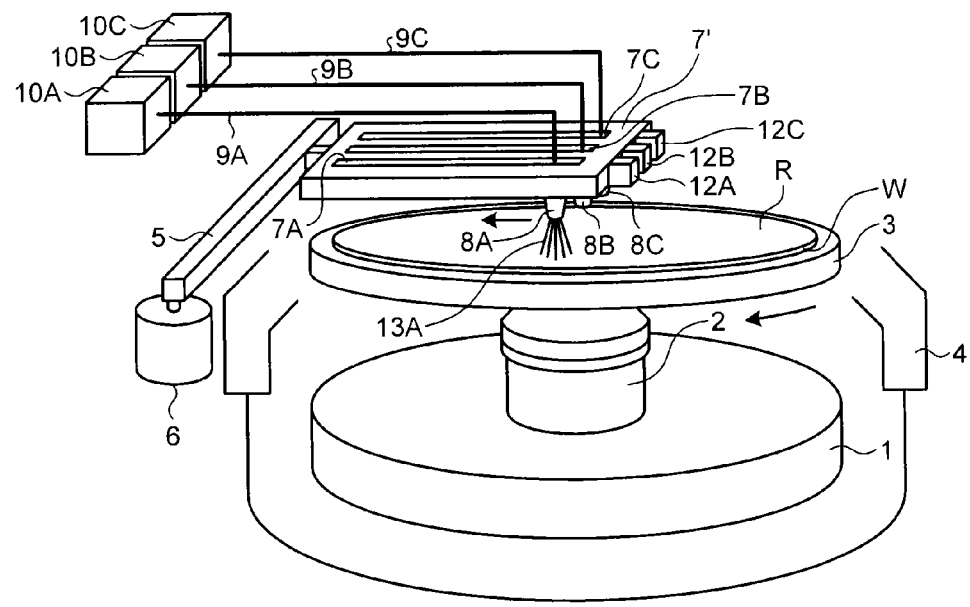
FIGS. 5A and 5B are perspective views showing the example of the developing method according to the second embodiment.
Figure 5B:
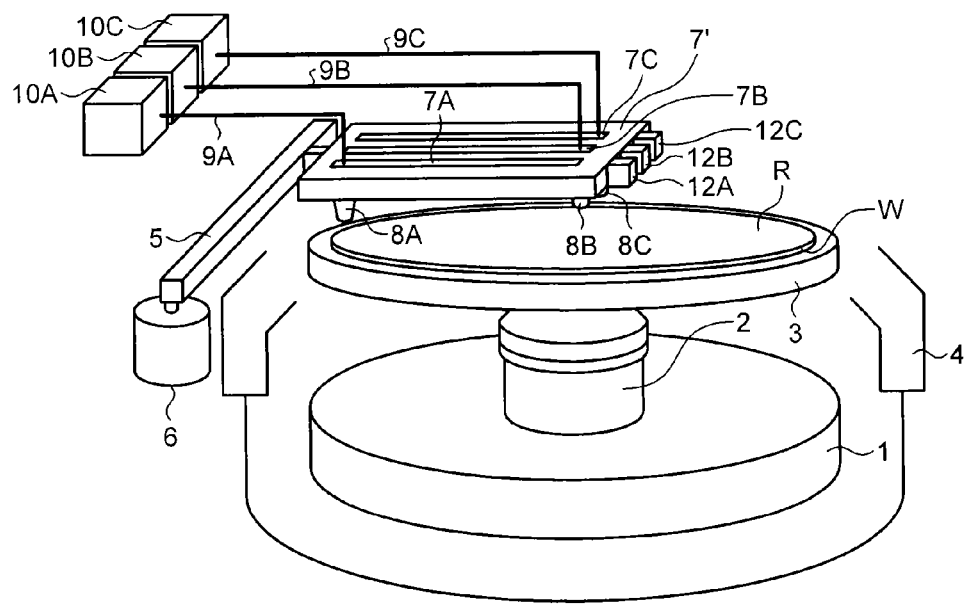

Then, as shown in FIGS. 5A and 5B, the wafer holder 3 is rotated via the motor 2, thereby rotating the wafer W. Then, with the rinse nozzle 8B staying still in the center of the wafer W, the developing solution nozzle 8A is moved along the guide section 7A from the center of the wafer W toward the periphery of the wafer W while the developing solution 13A is being supplied from the nozzle 8A onto the wafer W. When the developing solution nozzle 8A reaches the periphery of the wafer W, part of the developing solution 13A splashes outside. At this time, by holding the rinse nozzle 8B and the gas jet nozzle 8C still in the center of the wafer W, splashes of the developing solution 13A can be prevented from sticking to the rinse nozzle 8B and the gas jet nozzle 8C. Hence, while the rinse nozzle 8B and the gas jet nozzle 8C are scanned over the wafer W, drops of the developing solution 13A can be prevented from falling off the rinse nozzle 8B and the gas jet nozzle 8C onto the wafer W, thus preventing the occurrence of particles on the wafer W.

When the developing solution nozzle 8A reaches the periphery of the wafer W, the supply of the developing solution 13A is stopped. When the developing solution 13A is supplied onto the wafer W, the resist film R having a latent image formed therein is developed. At this time, static development can be performed for only 30 seconds, for example.

Figure 6A:
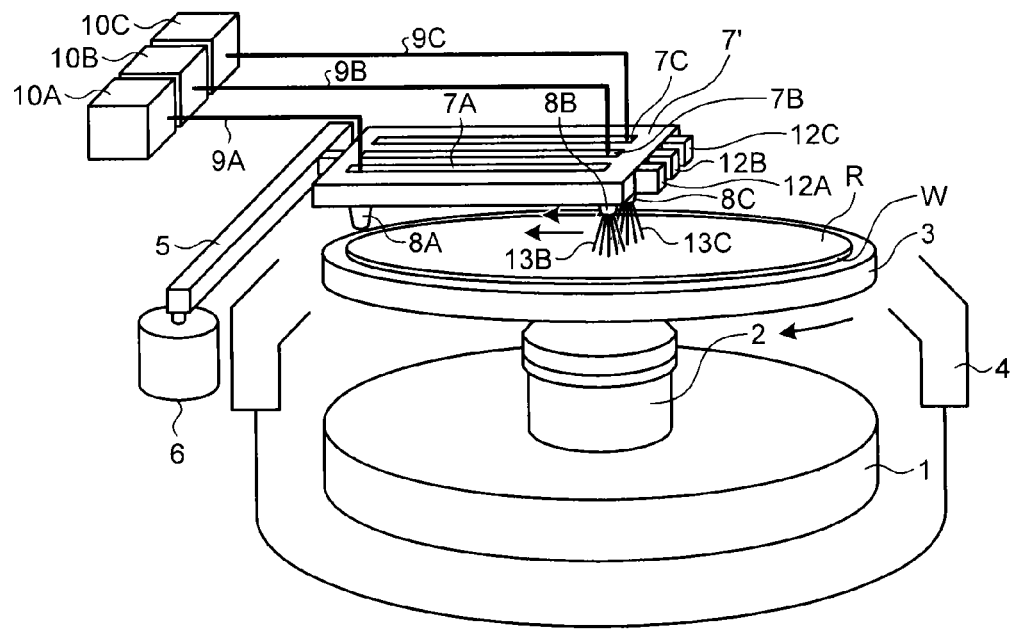
FIGS. 6A and 6B are perspective views showing the example of the developing method according to the second embodiment.
Figure 6B:
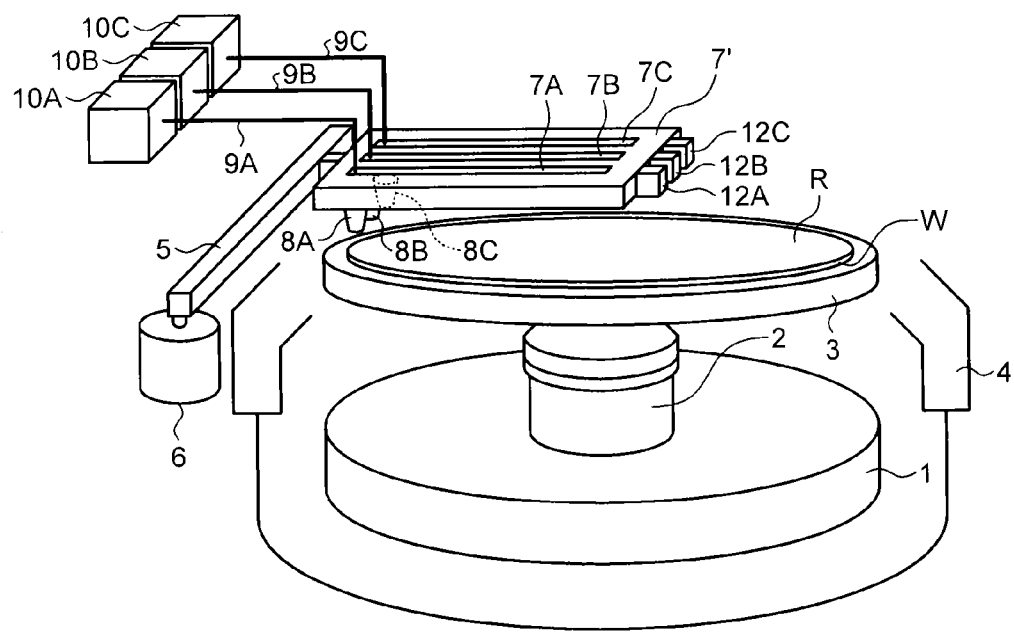

Next, as shown in FIGS. 6A and 6B, the rinse nozzle 8B is moved along the guide section 7B from the center of the wafer W toward the periphery while the rinse solution 13B is being supplied from the rinse nozzle 8B onto the wafer W. At this time, the gas jet nozzle 8C is moved along the guide section 7C from the center of the wafer W toward the periphery while the gas 13C is being supplied from the gas jet nozzle 8C onto the wafer W.

When the rinse nozzle 8B reaches the periphery of the wafer W, the supply of the rinse solution 13B is stopped. When the gas jet nozzle 8C reaches the periphery of the wafer W, the supply of the gas 13C is stopped. When the rinse solution 13B is supplied onto the wafer W, the developing solution 13A is drained from the wafer W, thus stopping development. Further, while the rinse solution 13B is being supplied, the wafer W is rotated, thus being spin-dried. By supplying the rinse solution 13B onto the wafer W while supplying the gas 13C onto the wafer W, the removal of part of the resist film R dissolved at development can be made more efficient.

Moving the rinse nozzle 8B and the gas jet nozzle 8C to the scan start position for the rinse nozzle 8B while the developing solution nozzle 8A is in the scan start position for the developing solution nozzle 8A, eliminates the need to move the rinse nozzle 8B and the gas jet nozzle 8C to the scan start position after the developing solution nozzle 8A reaches the scan end position. Accordingly, the time necessary to move the rinse nozzle 8B and the gas jet nozzle 8C to the scan start position can be reduced, thus improving productivity.

Further, by providing the nozzle guide 7' to guide the developing solution nozzle 8A, the rinse nozzle 8B, and the gas jet nozzle 8C, the developing solution nozzle 8A, the rinse nozzle 8B, and the gas jet nozzle 8C can be evacuated together at one time. Accordingly, an evacuation mechanism need not be provided separately for the developing solution nozzle 8A, the rinse nozzle 8B, and the gas jet nozzle 8C, and thus the evacuation mechanism can be simplified.

Although in the above second embodiment the configuration where the developing solution nozzle 8A, the rinse nozzle 8B, and the gas jet nozzle 8C are driven independently has been described, the rinse nozzle 8B and the gas jet nozzle 8C may be integrated so as to drive the rinse nozzle 8B and the gas jet nozzle 8C in one unit. In this case, a drive mechanism for driving the gas jet nozzle 8C need not be provided separately from a drive mechanism for driving the rinse nozzle 8B, and thus the drive mechanism can be simplified.

Third Embodiment

FIGS. 7A, 7B, 8A, 8B, 9A, and 9B are perspective views showing an example of a developing apparatus and developing method according to the third embodiment.

In FIGS. 7A, 7B, 8A, 8B, 9A, and 9B, this developing apparatus comprises a nozzle guide 7" and a developing control unit 11" instead of the nozzle guide 7 and developing control unit 11 of the developing apparatus of FIG. 1A.

The nozzle guide 7" has the guide section 7B and the nozzle driver 12B removed therefrom as compared with the nozzle guide 7 of FIG. 1A. The rinse nozzle 8B is adjacent to the scan start position for the developing solution nozzle 8A and fixed to the nozzle guide 7". For example, the rinse nozzle 8B can be fixed to the nozzle guide 7" in such a way as to be brought to a position over the center of the wafer W when the nozzle guide 7" is moved to a position over the wafer W. The motor 6 is connected to the nozzle guide 7" via the arm 5. The developing control unit 11" has the second nozzle drive control unit 11D removed therefrom as compared with the developing control unit 11 of FIG. 1A.

Figure 7A:
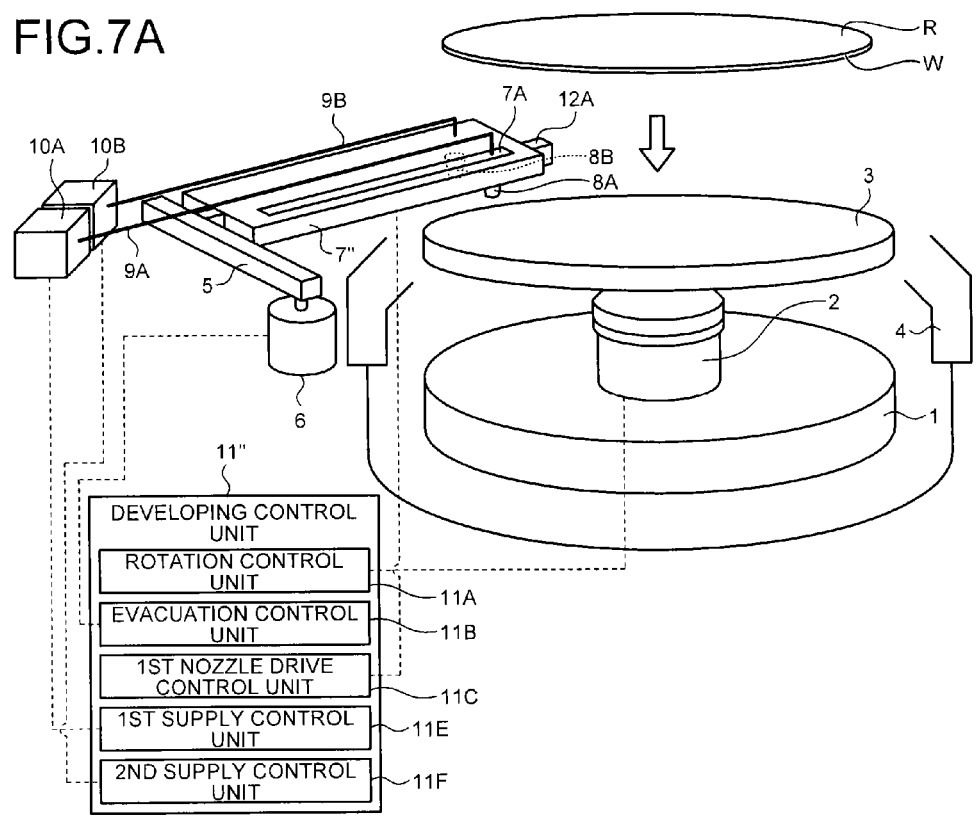
FIGS. 7A and 7B are perspective views showing an example of a developing method according to a third embodiment.

As shown in FIG. 7A, the arm 5 is driven via the motor 6, thereby evacuating the nozzle guide 7" outside the wafer holder 3. Then the wafer W coated with the resist film R is placed on the wafer holder 3. While the nozzle guide 7" is evacuated outside the wafer holder 3, the developing solution nozzle 8A can be moved to the scan start position along the guide section 7A.

Figure 7B:
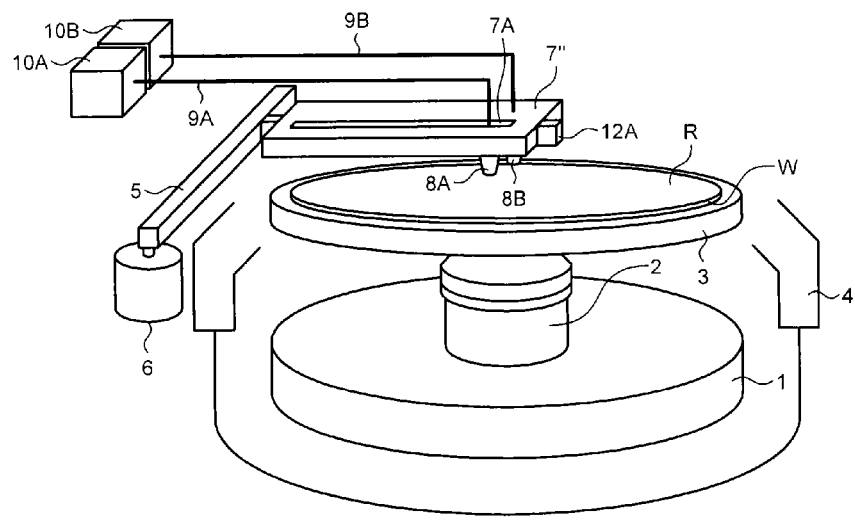

Then the arm 5 is driven via the motor 6 in the opposite direction to that at the time of evacuation, so that the nozzle guide 7" is moved to a position over the wafer W as shown in FIG. 7B. At this time, the developing solution nozzle 8A can be brought to a position over the center of the wafer W. Further, the rinse nozzle 8B remaining fixed to the nozzle guide 7" can be brought to a position over the center of the wafer W.

Figure 8A:
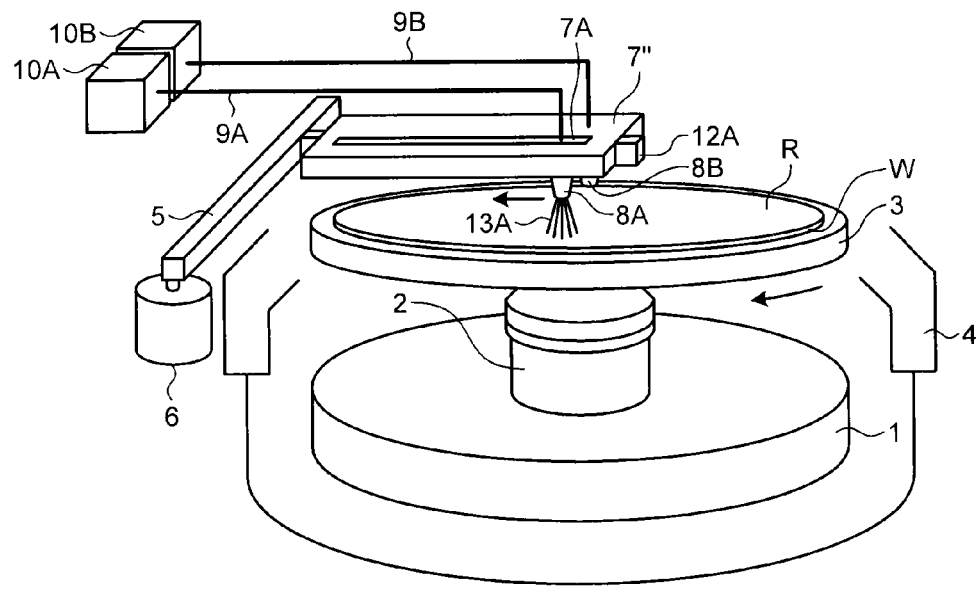
FIGS. 8A and 8B are perspective views showing the example of the developing method according to the third embodiment.
Figure 8B:
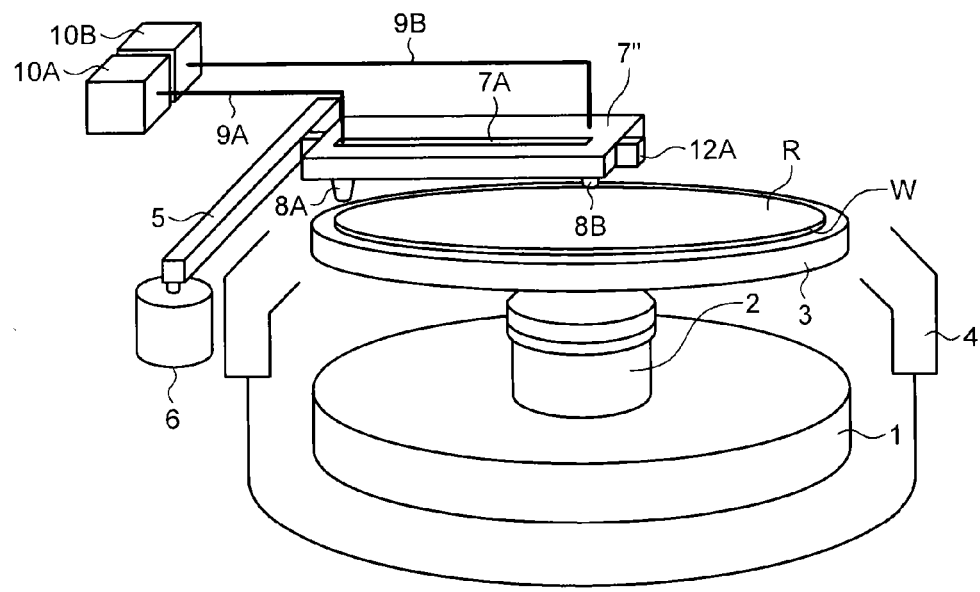

Then, as shown in FIGS. 8A and 8B, the wafer holder 3 is rotated via the motor 2, thereby rotating the wafer W. Then, with the rinse nozzle 8B staying still in the center of the wafer W, the developing solution nozzle 8A is moved along the guide section 7A from the center of the wafer W toward the periphery thereof while the developing solution 13A is being supplied from the developing solution nozzle 8A onto the wafer W. When the developing solution nozzle 8A reaches the periphery of the wafer W, part of the developing solution 13A splashes outside. At this time, by holding the rinse nozzle 8B still in the center of the wafer W, splashes of the developing solution 13A can be prevented from sticking to the rinse nozzle 8B. Hence, while the rinse nozzle 8B is supplying the rinse solution 13B onto the wafer W, drops of the developing solution 13A can be prevented from falling off the rinse nozzle 8B onto the wafer W, thus preventing the occurrence of particles on the wafer W.

When the developing solution nozzle 8A reaches the periphery of the wafer W, the supply of the developing solution 13A is stopped. When the developing solution 13A is supplied onto the wafer W, the resist film R having a latent image formed therein is developed. At this time, static development can be performed for only 30 seconds, for example.

Figure 9A:
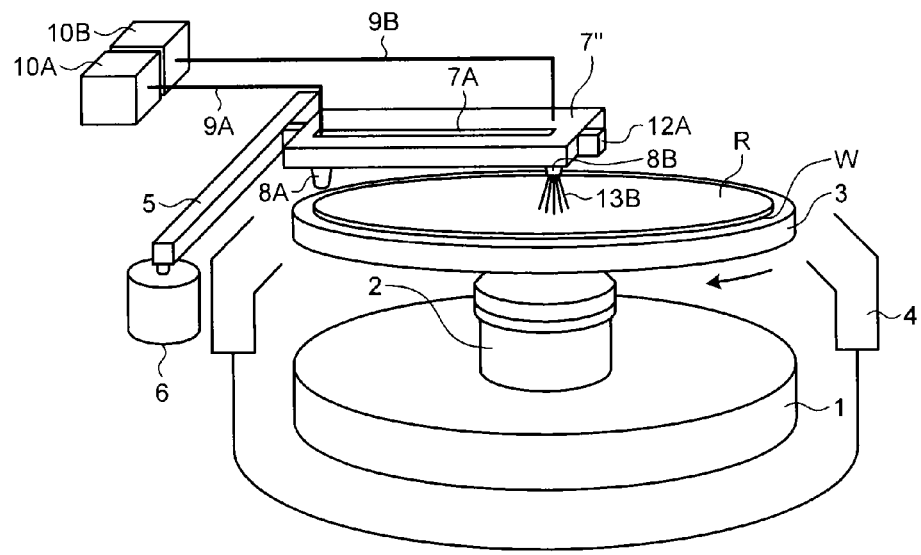
FIGS. 9A and 9B are perspective views showing the example of the developing method according to the third embodiment.
Figure 9B:
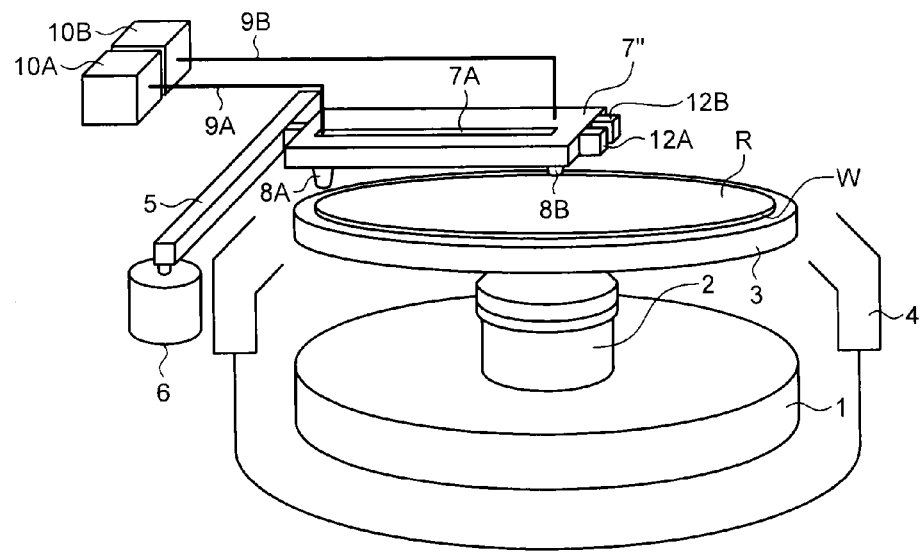

Next, as shown in FIGS. 9A and 9B, with the rinse nozzle 8B being fixed in the center of the wafer W, the rinse solution 13B is supplied from the rinse nozzle 8B onto the wafer W. After the rinse solution 13B is supplied onto the wafer W for a predetermined time, the supply of the rinse solution 13B is stopped. When the rinse solution 13B is supplied onto the wafer W, the developing solution 13A is drained from the wafer W, thus stopping development. Further, while the rinse solution 13B is being supplied, the wafer W is rotated, thus being spin-dried.

Fixing the rinse nozzle 8B to the nozzle guide 7" such that the rinse nozzle 8B comes to the center of the wafer W when the nozzle guide 7" is moved to a position over the wafer W, eliminates the need to move the rinse nozzle 8B to the center of the wafer W after the developing solution nozzle 8A reaches the scan end position. Accordingly, the time necessary to move the rinse nozzle 8B to the center of the wafer W can be reduced, thus improving productivity.

Further, by providing the nozzle guide 7" to hold the developing solution nozzle 8A and the rinse nozzle 8B, the developing solution nozzle 8A and the rinse nozzle 8B can be evacuated together at one time. Accordingly, an evacuation mechanism need not be provided separately for the developing solution nozzle 8A and the rinse nozzle 8B, and thus the evacuation mechanism can be simplified.

Yet further, because of fixing the rinse nozzle 8B to the nozzle guide 7", a drive mechanism for driving the rinse nozzle 8B need not be provided, and thus the drive mechanism can be simplified.

Although in the above third embodiment the configuration where the rinse nozzle 8B is fixed to the nozzle guide 7" has been described, it may take on a configuration where the rinse nozzle 8B and the gas jet nozzle 8C of FIG. 4A are fixed to the nozzle guide 7'.

Fourth Embodiment

Figure 10A:
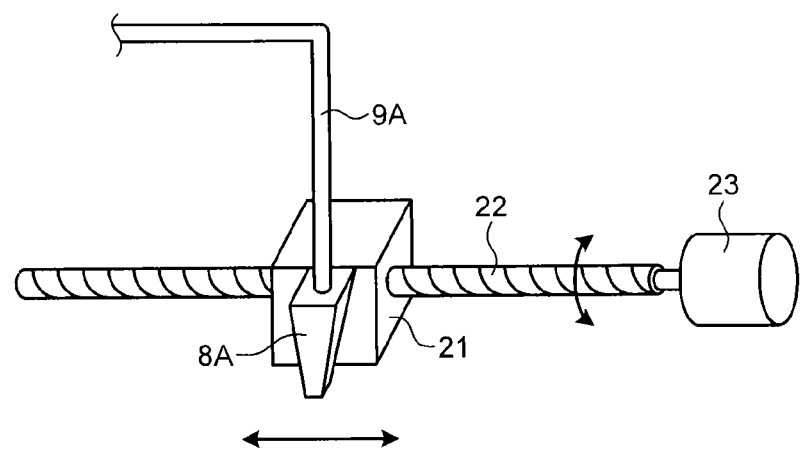
FIGS. 10A and 10B are perspective views showing schematically the configuration of the drive mechanism of a developing solution nozzle according to a fourth embodiment and a fifth embodiment respectively.

FIG. 10A is a perspective view showing schematically the configuration of the drive mechanism of a developing solution nozzle according to the fourth embodiment.

In FIG. 10A, this drive mechanism comprises a nozzle holder 21 to hold the developing solution nozzle 8A, a rotation shaft 22, and a motor 23. The rotation shaft 22 can be provided with a male screw, and the nozzle holder 21 can be provided with a female screw to engage the male screw of the rotation shaft 22. The developing solution nozzle 8A is fixed to the nozzle holder 21. The motor 23 is connected to one end of the rotation shaft 22. The rotation shaft 22 extends through the nozzle holder 21 such that its male screw engages the nozzle holder 21. When the motor 23 is rotated, the rotational motion is converted into linear motion via the nozzle holder 21 and the rotation shaft 22, so that the nozzle holder 21 moves linearly along the rotation shaft 22. Thus, the developing solution nozzle 8A can be made to move linearly together with the nozzle holder 21.

Fifth Embodiment

Figure 10B:
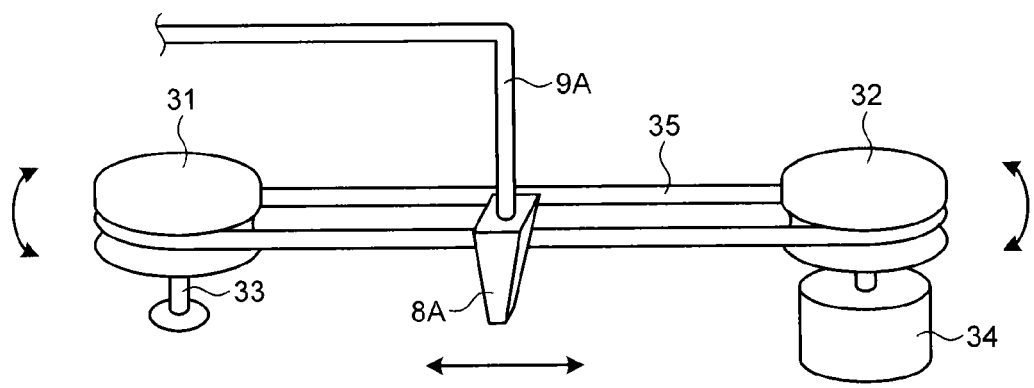

FIG. 10B is a perspective view showing schematically the configuration of the drive mechanism of a developing solution nozzle according to the fifth embodiment.

In FIG. 10B, this drive mechanism comprises pulleys 31, 32, a support shaft 33, a motor 34, and a belt 35. The pulley 31 is supported by the support shaft 33, and the pulley 32 is connected to the motor 34. The belt 35 runs between the pulleys 31, 32. The developing solution nozzle 8A is fixed to the belt 35. When the motor 33 is rotated, the rotational motion is converted into linear motion via the pulleys 31, 32 and the belt 35, so that the developing solution nozzle 8A can be made to move linearly as the belt 35 moves.

Although in the embodiments of FIGS. 10A and 10B the drive mechanism of the developing solution nozzle 8A is taken as an example, the drive mechanism of the rinse nozzle 8B can also be configured in the same way. Further, the drive mechanisms of FIGS. 10A and 10B can be attached to the nozzle guides 7, 7', 7". Here, the drive mechanisms of FIGS. 10A and 10B may be incorporated in the nozzle guides 7, 7', 7" or fixed to the outside of the nozzle guides 7, 7', 7".

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A developing apparatus comprising:
a wafer holder to hold a wafer;
a rotating unit that rotates the wafer holder;
a first nozzle to supply a developing solution onto the wafer;
a second nozzle to supply a rinse solution onto the wafer;
a nozzle guide that guides the first nozzle so as to be able to linearly scan directly above the wafer while holding the second nozzle in a position directly above the wafer to be adjacent to a scan start position for the first nozzle;
a first nozzle driver that drives the first nozzle while having the nozzle guide lead the first nozzle; and
a first nozzle drive control unit that drives and controls the first nozzle to move from the scan start position to a scan end position while supplying the developing solution onto the wafer.

2. The developing apparatus according to claim 1, wherein the nozzle guide guides the first nozzle and the second nozzle in such a way as to be able to linearly scan directly above the wafer independently and in parallel, the developing apparatus further comprising:
a second nozzle driver that drives the second nozzle while having the nozzle guide lead the second nozzle; and
a second nozzle drive control unit that drives and controls the second nozzle to move from a scan start position to a scan end position while supplying the rinse solution onto the wafer, wherein the second nozzle drive control unit moves the second nozzle before a scan start of the first nozzle to be located in a scan start position for the second nozzle while the first nozzle is in the scan start position for the first nozzle.

3. The developing apparatus according to claim 2, wherein the second nozzle drive control unit moves the second nozzle before a scan start of the first nozzle to be located in a position over the center of the wafer while the first nozzle is in a position over the center of the wafer.

4. The developing apparatus according to claim 1, further comprising an evacuation control unit that evacuates the nozzle guide outside the wafer holder to move the first nozzle and the second nozzle outside the wafer holder in a unified manner.

5. The developing apparatus according to claim 4, wherein the evacuation control unit evacuates the nozzle guide outside the wafer holder before the wafer is transferred onto the wafer holder and, after the wafer is transferred onto the wafer holder, moves the nozzle guide to a position over the wafer holder to make the first nozzle and the second nozzle held in a position directly above the wafer.

6. The developing apparatus according to claim 1, further comprising:
a third nozzle to jet a gas onto the wafer,
wherein the nozzle guide guides the first nozzle, the second nozzle, and the third nozzle in such a way as to be able to scan over the wafer independently, the developing apparatus further comprising:
a third nozzle driver that drives the third nozzle while having the nozzle guide lead the third nozzle; and
a third nozzle drive control unit that drives and controls the third nozzle to move from the center of the wafer toward the periphery thereof while supplying the rinse solution and the gas onto the wafer,
wherein the third nozzle drive control unit moves the third nozzle before a scan start of the first nozzle to be located in a scan start position for the third nozzle while the first nozzle is in the scan start position for the first nozzle.

7. The developing apparatus according to claim 6, wherein the third nozzle drive control unit moves the third nozzle before a scan start of the first nozzle to be located in a position over the center of the wafer while the first nozzle is in a position over the center of the wafer.

8. The developing apparatus according to claim 6, further comprising an evacuation control unit that evacuates the nozzle guide outside the wafer holder.

9. The developing apparatus according to claim 8, wherein the evacuation control unit evacuates the nozzle guide outside the wafer holder before the wafer is transferred onto the wafer holder and, after the wafer is transferred onto the wafer holder, moves the nozzle guide to a position over the wafer holder to make the first nozzle, the second nozzle, and the third nozzle held in a position over the wafer.

10. A developing method by a developing apparatus which comprises:
a wafer holder to hold a wafer;
a rotating unit that rotates the wafer holder;
a first nozzle to supply a developing solution onto the wafer;
a second nozzle to supply a rinse solution onto the wafer;
a nozzle guide that guides the first nozzle so as to be able to linearly scan directly above the wafer while holding the second nozzle in a position directly above the wafer to be adjacent to a scan start position for the first nozzle;
a first nozzle driver that drives the first nozzle while having the nozzle guide lead the first nozzle; and
a first nozzle drive control unit that drives and controls the first nozzle to move from the scan start position to a scan end position while supplying the developing solution onto the wafer, the developing method comprising:
moving the first nozzle from the scan start position to the scan end position, with holding the second nozzle to be adjacent to the scan start position for the first nozzle, while supplying the developing solution from the first nozzle onto the wafer being rotated by the rotating unit; and
supplying the rinse solution from the second nozzle onto the wafer being rotated by the rotating unit.

11. The developing method according to claim 10, wherein the nozzle guide guides the first nozzle and the second nozzle in such a way as to be able to linearly scan directly above the wafer independently and in parallel, the developing apparatus further comprising:
a second nozzle driver that drives the second nozzle while having the nozzle guide lead the second nozzle; and
a second nozzle drive control unit that drives and controls the second nozzle to move from a scan start position to a scan end position while supplying the rinse solution onto the wafer,
the developing method further comprising moving the second nozzle before a scan start of the first nozzle to be located in a scan start position for the second nozzle while the first nozzle is in the scan start position for the first nozzle.

12. The developing method according to claim 11, further comprising moving the second nozzle before a scan start of the first nozzle to be located in a position over the center of the wafer while the first nozzle is in a position over the center of the wafer.

13. The developing method according to claim 10, wherein the developing apparatus further comprises an evacuation control unit that evacuates the nozzle guide outside the wafer holder to move the first nozzle and the second nozzle outside the wafer holder in a unified manner.

14. The developing method according to claim 13, further comprising evacuating the nozzle guide outside the wafer holder before the wafer is transferred onto the wafer holder and, after the wafer is transferred onto the wafer holder, moving the nozzle guide to a position over the wafer holder to make the first nozzle and the second nozzle held in a position directly above the wafer.

15. The developing method according to claim 10, wherein the developing apparatus further comprises a third nozzle to jet a gas onto the wafer,
wherein the nozzle guide guides the first nozzle, the second nozzle, and the third nozzle in such a way as to be able to scan over the wafer independently, the developing apparatus further comprising:
a third nozzle driver that drives the third nozzle while having the nozzle guide lead the third nozzle; and
a third nozzle drive control unit that drives and controls the third nozzle to move from the center of the wafer toward the periphery thereof while supplying the rinse solution and the gas onto the wafer,
the developing method further comprising moving the third nozzle before a scan start of the first nozzle to be located in a scan start position for the third nozzle while the first nozzle is in the scan start position for the first nozzle.

16. The developing method according to claim 15, further comprising evacuating the nozzle guide outside the wafer holder before the wafer is transferred onto the wafer holder and, after the wafer is transferred onto the wafer holder, moving the nozzle guide to a position over the wafer holder to make the first nozzle, the second nozzle, and the third nozzle held in a position over the wafer, wherein the developing apparatus further comprises an evacuation control unit that evacuates the nozzle guide outside the wafer holder.

17. A developing apparatus comprising:
a wafer holder to hold a wafer;
a rotating unit that rotates the wafer holder;
a first nozzle to supply a developing solution onto the wafer;
a second nozzle to supply a rinse solution onto the wafer; and
a nozzle guide that guides the first nozzle so as to be able to linearly scan directly above the wafer while holding the second nozzle in a position directly above the wafer.

18. A developing apparatus according to claim 17, further comprising:
an arm that supports the nozzle guide so as to move the nozzle guide outside the wafer holder.

19. A developing apparatus according to claim 17, wherein the nozzle guide comprises:
a first guide section that guides the first nozzle so as to be able to linearly scan directly above the wafer; and
a second guide section that guides the second nozzle so as to be able to linearly scan directly above the wafer in parallel with the first nozzle.

20. A developing apparatus according to claim 17, wherein the nozzle guide comprises a guide section that guides the first nozzle so as to be able to linearly scan directly above the wafer, and the second nozzle is fixed to the nozzle guide.

* * * * *